United States Patent [19]

Saitoh et al.

[11] Patent Number: 4,546,008
[45] Date of Patent: Oct. 8, 1985

[54] METHOD FOR FORMING A DEPOSITION FILM
[75] Inventors: Keishi Saitoh; Wataru Ando, both of Ibaraki, Japan
[73] Assignee: Canon Kabushiki Kaisha, Tokyo, Japan
[21] Appl. No.: 667,816
[22] Filed: Nov. 2, 1984
[30] Foreign Application Priority Data Nov. 7, 1983 [JP] Japan ............................... 58-208813
Nov. 7, 1983 [JP] Japan ............................... 58-208814

[51] Int. Cl.⁴ .............................................. B05D 3/06
[52] U.S. Cl. ......................................... 427/38; 427/86
[58] Field of Search .................................... 427/38, 86

[56] References Cited
U.S. PATENT DOCUMENTS 4,260,647 4/1981 Wang ................................. 427/41 X Primary Examiner—Bernard D. Pianalto
Attorney, Agent, or Firm—Fitzpatrick, Cella, Harper & Scinto

[57] ABSTRACT

A method for forming a deposition film comprises applying an excitation energy to a silane compound (SiOA) in a gaseous state having at least one substituent (OA) of the formula of $-OC_aH_bX_c$ where $b+c=2a+1$, a is a positive integer, b and c are zero or a positive integer, provided that b and c are not simultaneously zero and X is halogen atom to form a deposition film containing silicon atom on a substrate.

A method for forming a deposition film comprises applying an excitation energy to a silane compound (SiA) in a gaseous state having 2-6 silicon atoms, having at least one substituent (A) of the formula of $-C_aH_bX_c$ where $b+c=2a+1$, a is a positive integer, b and c are zero or a positive integer, and X is halogen atom, containing at least one species selected from hydrogen atom and halogen atom, and further at least one of the silicon atoms present at the both ends bonding to only one species selected from hydrogen atom and halogen atom except for bonding to another silicon atom, to form a deposition film containing silicon atom on a substrate.

17 Claims, 1 Drawing Figure

METHOD FOR FORMING A DEPOSITION FILM

BACKGROUND OF THE INVENTION

1. Field of the Invention

This invention relates to a method for forming a deposition film, and in particular, to a method for forming a deposition film on a desired substrate such as photoconductive film, semiconductor film, insulating film and the like by using electric, light or thermal energy.

2. Description of the Prior Art

Heretofore, it has been known that $SiH_4$ is decomposed by an excitation energy such as discharge, thermal energy and the like to form a deposition film of amorphous silicon (hereinafter referred to as "a-Si") on a substrate and the resulting deposition film is used for various purposes.

However, conventional methods for forming a-Si deposition films using $SiH_4$ as the starting material have the following drawbacks to be solved:

(1) The film forming velocity is slow when a high quality of the film is to be kept;

(2) High excitation energy is required regardless of the type of the fed energy; and (3) Upon forming a large area or thick deposition film, it is difficult to ensure uniform electric or optical characteristics and stable quality, and there are liable to be caused inrregularity of the film surface and defects in the bulk of the film during the formation of the film.

For the purpose of solving such problems, a method for forming an a-Si deposition film using $Si_2H_6$ as a starting material has been recently proposed and come into the limelight, but is still insufficient to solve the problems. In particular, when heat energy is used as the excitation energy source, a high temperature of at least 400° C. is necessary and therefore, lowering the necessary energy and making the thermal efficiency higher are still to be solved in future. Since $Si_2H_6$ is decomposed to easily form $SiH_4$ and excitation decoposition products, $Si_2H_6$ is better than $SiH_4$. However, from the standpoint of reaction theory, efficient decomposition of $Si_2H_6$ can be conducted when $Si_4$, a main decomposition product of the decomposition, successively decomposes further. Therefore, the remarkably efficient decomposition can be expected only limitedly.

In addition, $Si_2H_6$ is not a material easily available and its production process has not yet been eastablished so that $Si_2H_6$ is expensive. Thus, the method using $Si_2H_6$ can not be practically carried out from the economical point of view. U.S. Pat. No. 4,363,828 discloses that higher silanes such as $Si_2H_6$ and the higher ones can be used. However, there is not any actual example that such higher silanes are produced at a high yield and the deposition films are practically utilized as a useful material. Furthermore, the commercial processes will be completed only after practical processes for producing the higher silanes and techniques for utilization thereof have been developed.

If the fabrication of the deposition film can be effected at a low energy level, the formation of the deposition film having uniformity and high quality can be expected and the fabrication conditions can be easily controlled, and moreover, the commercial productivity including reproducibility can be improved. For example, in the case of glow discharge deposition, the effect of discharge energy of high power on the deposition film during the formation thereof is so large that it is difficult at present to control stably the fabrication conditions ensuring reproducibility.

In the case of a thermal energy deposition process, a high temperature is required so that the substrate material for forming the deposition film is limited, and in addition, the probability of releasing of the useful bonded hydrogen atoms in a-Si increases and thereby the desired characteristics are obtained with difficulty. Furthermore, the decomposition efficiency is so low that the deposition velocity is slow and, therefore, the process is not suitable for mass production.

On the other hand, heretofore, it has been also proposed to use silane gases of a higher order such as

and the like, in addition to the above-mentioned silane gases such as $SiH_4$, $Si_2H_6$ and the like. However, $SiH_4$, $S_2H_6$ and a series of silanes as mentioned above are explosively burned with oxygen in air so that the handling is very difficult.

SUMMARY OF THE INVENTION

An object of the present invention is to provide a method for forming a deposition film free from the above-mentioned drawbacks.

Another object of the present invention is to provide a method for forming a deposition film which can give a high speed of film formation while the quality of the resulting film is good.

A further object of the present invention is to provide a method for forming a deposition film where a discharge energy of low power can be used, or, in the case of light energy and heat energy, low decomposition temperature is available.

Still another object of the present invention is to provide a method for forming a deposition film which can produce a deposition film of high quality having uniform electric and optical characteristics and stable quality even when the deposition film is thick and of a large area.

A still further object of the present invention is to provide a method for forming a deposition film which can use safe starting gases of easy handling.

According to one aspect of the present invention, there is provided a method for forming a deposition film which comprises applying an excitation energy to a silane compound (SiOA) in a gaseous state having at least one substituent (OA) of the formula of $-O-C_aH_bX_c$ where $b+c=2a+1$, a is a positive integer, b and c are zero or a positive integer, provided that b and c are not simultaneously zero and X is halogen atom to form a deposition film containing silicon atom on a substrate.

According to another aspect of the present invention, there is provided a method for forming a deposition film which comprises applying an excitation energy to a silane compound (SiA) in a gaseous state having 2-6 silicon atoms, having at least one substituent (A) of the formula of $-C_aH_bX_c$ where $b+c=2a+1$, a is a positive integer, b and c are zero or a positive integer, and X is halogen atom, containing at least one species selected from hydrogen atom and halogen atom, and further at least one of the silicon atoms present at the both ends bonding to only hydrogen atom or halogen atom or both, except for bonding to another silicon atom, to form a deposition film containing silicon atom on a substrate.

DETAILED DESCRIPTION OF THE PREFERRED EMBODIMENTS

Figure 1:
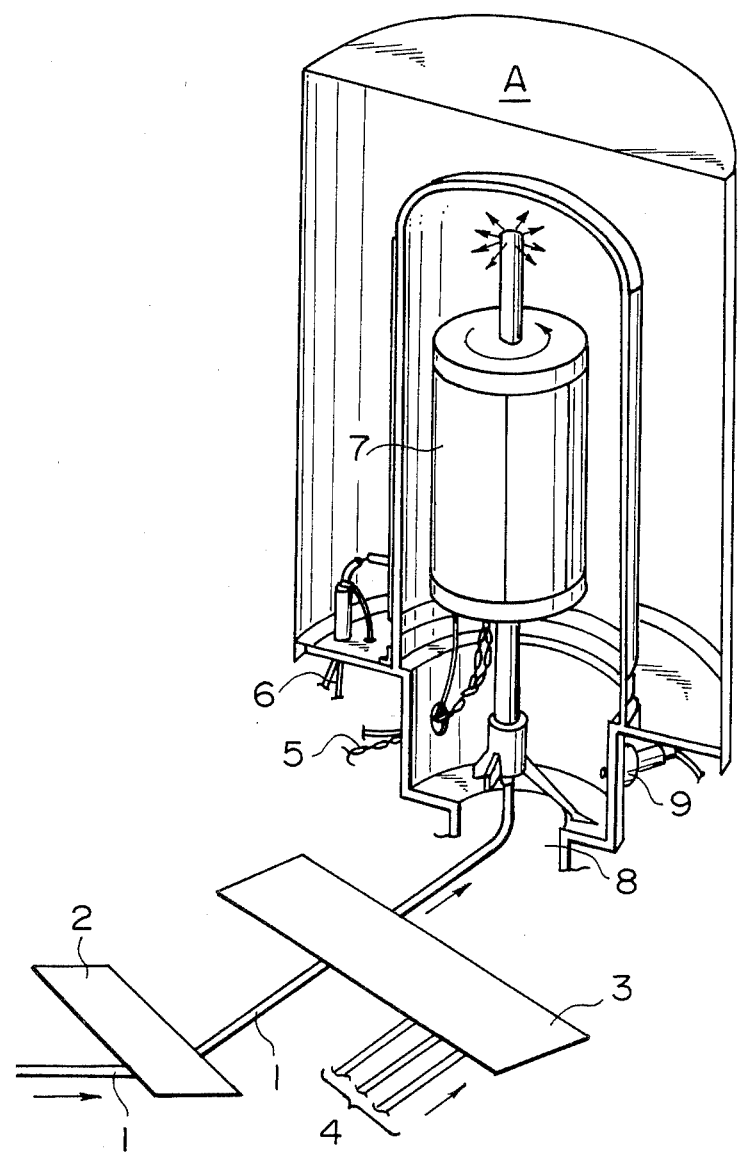
FIG. 1 shows schematically an example of an apparatus for forming a deposited film on a photosensitive drum according to the present invention.

Referring now to FIG. 1, the method according to the present invention will be described in detail below.

Silane compound (SiA and/or SiOA) is vaporized in vaporization apparatus 2 through pipe 1 for introduction and introduced into a deposition chamber being controlled to normal pressure or reduced pressure through mass flow meter 3. The vaporized silane compound (SiA and/or SiOA) introduced into the deposition chamber is subjected to photolysis, thermal decomposition and discharge decomposition, for example, to form a photoconductive film comprised of a-Si on a predetermined substrate 7 composed of an aluminium cylinder. Numerals 4, 5, 6, 8 and 9 denote a pipe for introducing a gas mixture, a lead for heating and earth, a lead, an exhaust port of a deposition chamber, and a deposition chamber pressure sensor, respectively. Though the above example refers to only the formation of a photoconductive film on a photosenditive drum, the present invention is not limited thereto, but can be applied to the formation of various other deposition films.

The silane compounds (SiA) used in the method of the present invention are limited such that the number of silicon atom is 2–6, but, for forming a good quality of a-Si film, the number is preferably 2–5 and more preferably 2–4. When the number of silicon atom is 7 or more, its decomposition is easy and it is expected that the desired deposition film is obtained by a low energy excitation. But, contrary to expectation, we have found that the quality as a photoconductive film and a semiconductor film is inferior, a lot of defect on the surface of the film and disorder in a bulk occur, and thereby an ununiform film is produced. Therefore, it is difficult to control the formation of the deposition film with such a starting gas.

The number of carbon atom of substituents (A) contained in silane compounds (SiA) is preferably 1 to 11, more preferably 1 to 5, and most preferably 1 to 3. When the total number of carbon atom is 12 or more, it is difficult to vaporize or the synthesize silane compounds (SiA). In addition, there occurs a problem that the decomposition efficiency of silane compounds (SiA) is lowered. Usable substituents (A) are, for example,

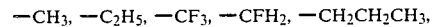

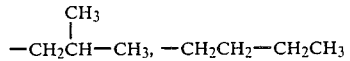

and the like.

Bond energy of substituents (A) in silane compounds is larger than that of hydrogen atoms. Therefore, oxidation of silicon atom by oxygen is prevented and silane compounds are stable to oxygen.

As substituents except for substituents (A) in silane compounds (SiA) in the present invention, hydrogen atom and halogen atom are contained. Halogen atom is preferably fluorine atom (F) and chlorine atom (Cl).

In silane compounds (SiA) in the present invention, at least one of silicon atoms at both ends bonds to only hydrogen atom or halogen atom or both, excluding bonding to a silicon atom. Therefore, :SiH$_2$, :SiHX, and :SiX$_2$ (X is halogen atom) radicals are easily formed by thermal decomposition and an a-Si film of good quality is formed. Silane compounds suitable for thermal decomposition methods are, for example,

| | |
|---|---|
| H$_3$SiSiH$_2$(CH$_3$) | (No. 1A), |
| H$_3$SiSiH(CH$_3$)$_2$ | (No. 2A), |
| H$_3$SiSi(CH$_3$)$_3$ | (No. 3A), |
| H$_3$SiSiH$_2$SiH$_2$(CH$_3$) | (No. 4A), |
| H$_3$SiSiH$_2$SiH(CH$_3$)$_2$ | (No. 5A), |
| H$_3$SiSiH$_2$Si(CH$_3$)$_3$ | (No. 6A), |
| H$_3$SiSiH(CH$_3$)Si(CH$_3$)$_3$ | (No. 7A), |
| H$_3$SiSi(CH$_3$)$_2$Si(CH$_3$)$_3$ | (No. 8A), |
| H$_3$SiSiH(CH$_3$)SiH$_2$(CH$_3$) | (No. 9A), |
| H$_3$SiSiH(CH$_3$)SiH(CH$_3$)$_2$ | (No. 10A), |
| H$_3$SiSiH$_2$SiH$_2$SiH$_2$(CH$_3$) | (No. 11A), |
| H$_3$SiSiH$_2$SiH$_2$SiH(CH$_3$)$_2$ | (No. 12A), |
| H$_3$SiSiH$_2$SiH$_2$Si(CH$_3$)$_3$ | (No. 13A), |
| H$_3$SiSi(CH$_3$)$_2$Si(CH$_3$)$_2$Si(CH$_3$)$_3$ | (No. 14A), | and the like.

The above-mentioned silane compounds (SiA) are examples of the compounds capable of depositing a-Ai films of good quality by thermal decomposition methods. These silane compounds (SiA) may also be used as a starting gas for producing electrophotographic materials by glow discharge decomposition methods where the resulting film may contain carbon.

In the present invention, the substituent OA contained in a silane compound (SiOA) employed as a starting material for forming a deposition film may be an unsubstituted or substituted alkoxylgroup (referred to generically as an alkoxyl group) and preferably has 1 to 10 carbon atoms.

That is, a silane compound having an alkoxyl group of eleven or more carbon atoms is so difficult to be gasified that it can hardly improve the productivity of deposition films. In addition, the production cost of such a silane compound itself is too high to lower the total costs of producing deposition films. Further, the decomposition rate is lowered so that the improvement in film forming efficiency is hindered.

Suitable silane compounds for use in the process of the present invention preferably contain six or less silicon atoms. In general, it is expected that silane compounds containing seven or more silicon atoms are easily decomposed due to the structure thereof to form a deposition film using a low decomposition energy. However, contrary to the above expectation, our test results showed that photoconductive layers or semiconductor layers produced by using such a silane compound are inferior in quality and have an ununiform structure such that there are many defects in the surface part and the interior of the bulk is much disordered. Therefore, when such a starting gas is used, it is difficult ot control the quality of the deposition film to be formed.

As described above, silane compounds (SiOA) as used in the present invention have at least one alkoxyl group. In this case, it is preferred that at least one of hydrogen atoms bonded to the silicon atom at the chain end is substituted by an alkoxyl group, and it is more preferred that, in the case of a silane compound having two or more silicon atoms, at least one alkoxyl group is attached to each of the silicon atoms at the both ends.

When the substituent OA has X as a constituent atom in the present invention, suitable X includes fluorine (F) and chlorine (Cl).

Silane compounds (SiOA) as used in the present invention have at least one substituent OA. These compounds may further be substituted by hydrogen atom, halogen atom, or an atomic group such as unsubstituted alkyl group, substituted alkyl groups, and the like.

In this case, it is preferred that such substituted or unsubstituted alkyl group (referred to generically as alkyl group) has 1 to 9 carbon atoms, and it is more preferred to select suitable number taking into consideration the number of carbon atoms constituting other substituents in the silane compound in such a way that the total number of carbon atoms is ten or less.

Silane compounds (SiOA) as used in the present invention can be easily decomposed by excitation energy such as discharge energy, thermal energy, and the like to form a deposition film using less energy. It is believed that alkoxyl groups (substituents OA) bonded to a silane compound (SiOA) tend to break an Si-Si bond or an Si-A bond (A is H, X or an alkyl group) to easily generate radicals or ions having less number of atomic groups such as SiY, SiY$_2$ (Y is selected from H, X, an alkyl group and an alkoxyl group) or Si as compared to other silane compounds. Therefore, the decomposition efficiency is suprisingly increased to contribute to improvement in deposition efficiency and deposition rate. Further, where discharge energy is to be utilized to carry out the present invention, it is possible to form a deposition film excellent in electrical or optical characteristics in high deposition efficiency and high deposition rate without increasing discharging power or gas flow rate.

This is contrary to the prior art cognizance. On the other hand, where thermal energy is utilized for the decomposition to form a deposition film in accordance with this invention, it is also possible, depending somewhat upon what sort of an apparatus is used, to form a deposition layer in high efficiency even at a temperature of 100° to 350° C. Preferable examples of the silane compounds (SIOR) are as shown below.

(1) Chain silane compounds

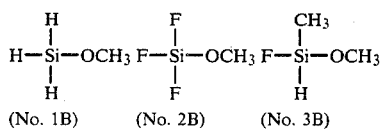

(No. 1B) (No. 2B) (No. 3B)

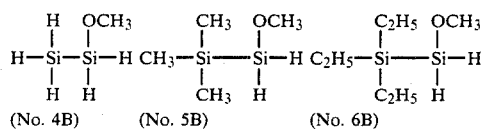

(No. 4B) (No. 5B) (No. 6B)

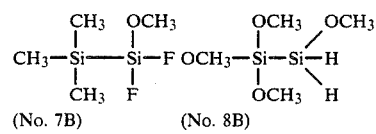

(No. 7B) (No. 8B)

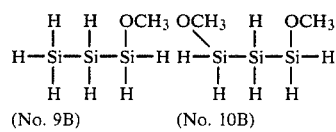

(No. 9B) (No. 10B)

-continued

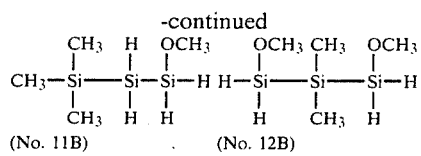

(No. 11B) (No. 12B)

(2) Cyclic silane compounds

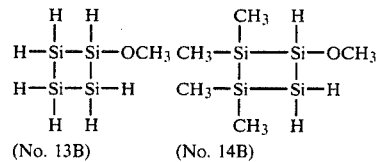

(No. 13B) (No. 14B)

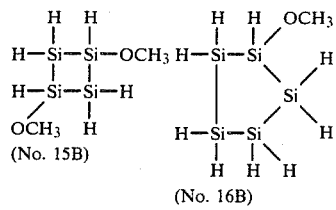

(No. 15B) (No. 16B)

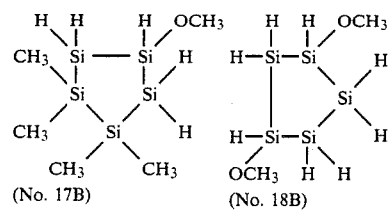

(No. 17B) (No. 18B)

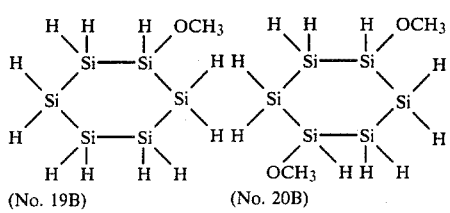

(No. 19B) (No. 20B)

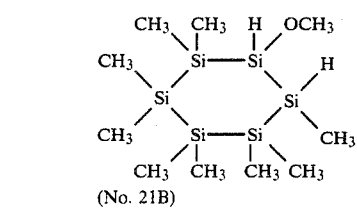

(No. 21B)

In order to produce a-Si films of good quality, silane compounds (SiOA) which generate only :SiH$_2$, :SiHX, and :SiX$_2$ where X is halogen atom, are suitable. Among the above-mentioned silane compounds (SiOR), such suitable compounds are, for example, compound Nos. 4B, 5B, 6B, 9B, 10B, 11B, 13B, 16B, and 19B.

EXAMPLE 1

Using the apparatus shown in FIG. 1, silane compound (SiA) (No. 1 to No. 14), SiH$_4$, Si$_2$H$_6$, or

as a starting material for forming a deposition film was vaporized in vaporization apparatus 2 through pipe 1, controlled with mass flow meter 3 to a flow rate of 150

SCCM and introduced into apparatus A for forming the deposition film. A starting gas controlled to an internal pressure of 0.1 Torr was flowed on a substrate drum made of Al heated to a predetermined temperature and thermally decomposed to form a photoconductive film of a-Si on the substrate drum made of Al.

In Table 1A, formation temperature and deposition rate of the deposition film, electric characteristics of the film, and stability of the starting gas to air at room temperature are shown.

EXAMPLE 2

The same starting materials as in Example 1 were introduced into apparatus A for forming a deposition film according to the same operation as in Example 1. A substrate drum made of Al was heated to 250° C., a gas flow rate and an internal pressure were controlled to 150 SCCM and 0.1 Torr, respectively, and a glow discharge was excited to form a deposited film of a-Si. Deposition rate and electric characteristics of the resulting deposition film as to starting gas are shown in Table 2A.

EXAMPLE 3

(SiOA) (No. 1B to No. 21B) as a starting material for forming a film.

Each starting material was vaporized in vaporization apparatus 2 through pipe 1, controlled with mass flow meter 3 to a predetermined flow rate, and introduced into apparatus A for forming the deposited film. A starting gas controlled to a predetermined pressure was flowed on a substrate drum made of Al heated to a predetermined temperature and thermally decomposed to form a photoconductive film of a-Si on the substrate drum made of Al.

In Table 1B, a formation temperature and a deposition rate of the deposition film, and electric characteristics of the film are shown.

EXAMPLE 4

The same starting materials as in Example 3 were introduced into apparatus A for forming a deposition film according to the same operation as in Example 1. A substrate drum made of Al was heated to 250° C. and a glow descharge was excited to form a deposition film of a-Si. In this case, a deposition rate of the resulting deposition film as to each starting gas is shown in Table 2B.

TABLE 1A

| Chemical formula or compound No. | SiH$_4$ | Si$_2$H$_6$ | ($-$SiH$_2$$-$)$_5$ | 1A | 2A | 3A | 4A | 5A | 6A | 7A | 8A | 9A | 10A | 11A | 12A | 13A | 14A |
|---|---|---|---|---|---|---|---|---|---|---|---|---|---|---|---|---|---|
| Substrate temperature (°C.) | 400 | 400 | 280 | 400 | 400 | 400 | 300 | 300 | 300 | 300 | 300 | 300 | 300 | 250 | 250 | 250 | 250 |
| Deposition rate (Å/sec) | — | 0.4 | 12 | 0.4 | 0.4 | 0.4 | 10 | 10 | 10 | 5 | 5 | 5 | 5 | 15 | 15 | 15 | 10 |
| Electric characteristics | — | Δ | ◎ | Δ | Δ | Δ | ◎ | ◎ | ◎ | ○ | ○ | ○ | ○ | ○ | ○ | ○ | ○ |
| Stability of gas** | X | X | X | Δ | ○ | ◎ | Δ | ○ | ○ | ○ | ◎ | ○ | ○ | Δ | Δ | Δ | ◎ |

\* ◎: Very good
○: Good
Δ: Usable
X: Not usable (as a photosensitive material for electrophotography)
\*\* ◎: Very stable
○: Stable
Δ: Relatively stable
X: Instable

TABLE 2A

| Chemical formula or compound No. | SiH$_4$ | Si$_2$H$_6$ | ($-$SiH$_2$$-$)$_5$ | 1A | 2A | 3A | 4A | 5A | 6A | 7A | 8A | 9A | 10A | 11A | 12A | 13A | 14A |
|---|---|---|---|---|---|---|---|---|---|---|---|---|---|---|---|---|---|
| Discharge power (W/cm$^2$) | 0.18 | 0.18 | 0.18 | 0.18 | 0.18 | 0.18 | 0.18 | 0.18 | 0.18 | 0.18 | 0.18 | 0.18 | 0.18 | 0.18 | 0.18 | 0.18 | 0.18 |
| Deposition rate (Å/sec) | 5 | 10 | 30 | 10 | 10 | 10 | 20 | 20 | 20 | 20 | 20 | 20 | 20 | 40 | 40 | 40 | 40 |
| Electric characteristics* | ◎ | ◎ | ◎ | ◎ | ○ | Δ | ◎ | ○ | Δ | Δ | X | Δ | Δ | ◎ | ◎ | ○ | X |

\* ◎: Very good
○: Good
Δ: Usable
X: Not usable (as a photosensitive material for electrophotography)

Using the apparatus shown in FIG. 1, a deposition film was formed with SiH$_4$, Si$_2$H$_6$, or silane compound

TABLE 1B

| Chemical formula or compound No. | SiH$_4$ | Si$_2$H$_6$ | 1B | 2B | 3B | 4B | 5B | 6B | 7B | 8B | 9B | 10B |
|---|---|---|---|---|---|---|---|---|---|---|---|---|
| Deposition rate (Å/s) | — | 0.4 | 5 | 5 | 5 | 30 | 30 | 30 | 30 | 30 | 50 | 50 |
| Electric characteristics | — | Δ | Δ | Δ | Δ | ◎ | ◎ | ◎ | ○ | ◎ | ◎ | ◎ |
| Substrate temperature | 400 | 400 | 350 | 350 | 350 | 350 | 300 | 300 | 300 | 300 | 250 | 250 |

TABLE 1B-continued

| (°C.) | | | | | | | | | | | | |
|---|---|---|---|---|---|---|---|---|---|---|---|---|
| Flow rate (SCCM) | 150 | 150 | 150 | 150 | 150 | 150 | 150 | 150 | 150 | 150 | 150 | 150 |
| Pressure (Torr) | 1 | 1 | 1 | 1 | 1 | 1 | 1 | 1 | 1 | 1 | 1 | 1 |
| Chemical formula or compound No. | 11B | 12B | 13B | 14B | 15B | 16B | 17B | 18B | 19B | 20B | 21B | |
| Deposition rate (Å/s) | 50 | 50 | 50 | 50 | 50 | 40 | 40 | 40 | 30 | 30 | 30 | |
| Electric characteristics | ⊚ | Δ | ⊚ | Δ | ⊚ | ⊚ | Δ | ⊚ | ⊚ | ⊚ | X | |
| Substrate temperature (°C.) | 250 | 250 | 200 | 200 | 200 | 250 | 250 | 250 | 250 | 250 | 250 | |
| Flow rate (SCCM) | 150 | 150 | 150 | 150 | 150 | 150 | 150 | 150 | 150 | 150 | 150 | |
| Pressure (Torr) | 1 | 1 | 1 | 1 | 1 | 1 | 1 | 1 | 1 | 1 | 1 | |

Evaluation standards:
Electric characteristics (from the standpoint of electrophotography)
⊚ : Very good
○ : Good
Δ Usable
X: Not usable

TABLE 2B

| Chemical formula or compound No. | $SiH_4$ | $Si_2H_6$ | 1B | 2B | 3B | 4B | 5B | 6B | 7B | 8B | 9B | 10B |
|---|---|---|---|---|---|---|---|---|---|---|---|---|
| Discharge power (W/cm²) | 0.18 | 0.18 | 0.18 | 0.18 | 0.18 | 0.18 | 0.18 | 0.18 | 0.18 | 0.18 | 0.18 | 0.18 |
| Deposition rate (Å/sec) | 5 | 10 | 15 | 15 | 15 | 50 | 50 | 50 | 50 | 50 | 60 | 60 |
| Chemical formula or compound No. | 11B | 12B | 13B | 14B | 15B | 16B | 17B | 18B | 19B | 20B | 21B | |
| Dicharge power (W/cm²) | 0.18 | 0.18 | 0.18 | 0.18 | 0.18 | 0.18 | 0.18 | 0.18 | 0.18 | 0.18 | 0.18 | |
| Deposition rate (Å/sec) | 60 | 60 | 60 | 60 | 60 | 50 | 50 | 50 | 30 | 30 | 30 | |

We claim:

1. A method for forming a deposition film on a substrate, which comprises applying an excitation energy to a silane compound (SiOA) in a gaseous state having at least 2 silicon atoms and at least one substituent (OA) of the formula of $-OC_aH_bX_c$, where $b+c=2a+1$, a is a positive integer, b and c are zero or a positive integer, provided that b and c are not simultaneously zero, and x is a halogen atom, to form a deposition film compound containing silicon atoms on the substrate.

2. The method according to claim 1 in which the substituent (OA) is unsubstituted alkoxyl.

3. The method according to claim 2 in which the unsubstituted alkoxyl has 1-10 carbon atoms.

4. The method according to claim 1 in which the silane compound has 2 to 6 silicon atoms.

5. The method according to claim 1 in which X is at least one member selected from F and Cl.

6. The method according to claim 1 in which the silane compound (SiOA) has alkyl as a substituent.

7. The method according to claim 6 in which the alkyl has 1-9 carbon atoms.

8. The method according to claim 1 in which the silane compound (SiOA) is a member selected from the following compounds:

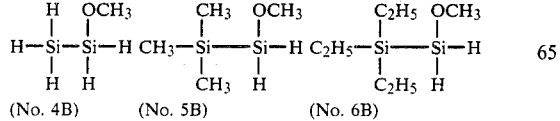

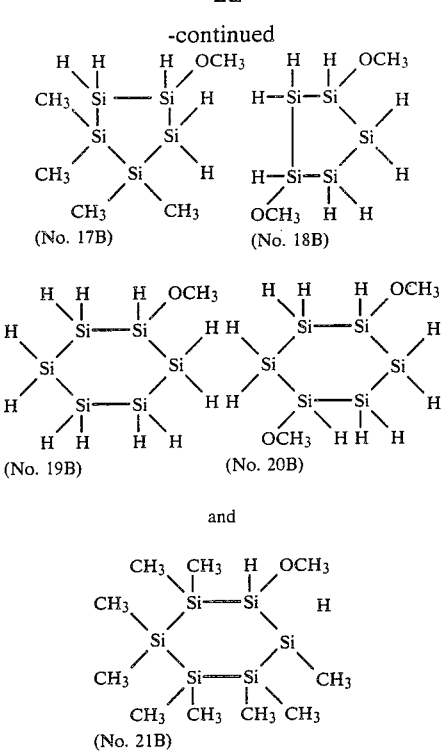

(No. 17B)
(No. 18B)
(No. 19B)
(No. 20B)

and (No. 21B)

9. A method for forming a deposition film which comprises applying an excitation energy to a silane compound (SiA) in a gaseous state having 2-6 silicon atoms, having at least one substituent (A) of the formula of $-C_aH_bX_c$ where $b+c=2a+1$, a is a positive integer, b and c are zero or a positive integer, and X is halogen atom, containing at least one species selected from hydrogen atom and halogen atom, and further at least one of the silicon atoms present at the both ends bonding to only hydrogen atom or halogen atom or both, except for bonding to another silicon atom, to form a deposition film containing silicon atom on a substrate.

10. The method according to claim 9 in which the substituent (A) is a member selected from $-CH_3$, $-C_2H_5$, $-CF_3$, $-CFH_2$, $-CH_2CH_2CH_3$, $$-CH_2\overset{\overset{CH_3}{|}}{C}H-CH_3, \text{ and } -CH_2CH_2CH_2CH_3.$$

11. The method according to claim 9 in which the silane compound (SiA) is selected from the following compounds:

| | |
|---|---|
| $H_3SiSiH_2(CH_3)$ | (No. 1A) |
| $H_3SiSiH(CH_3)_2$ | (No. 2A) |
| $H_3SiSi(CH_3)_3$ | (No. 3A) |
| $H_3SiSiH_2SiH_2(CH_3)$ | (No. 4A) |
| $H_3SiSiH_2SiH(CH_3)_2$ | (No. 5A) |
| $H_3SiSiH_2Si(CH_3)_3$ | (No. 6A) |
| $H_3SiSiH(CH_3)Si(CH_3)_3$ | (No. 7A) |
| $H_3SiSi(CH_3)_2Si(CH_3)_3$ | (No. 8A) |
| $H_3SiSiH(CH_3)SiH_2(CH_3)$ | (No. 9A) |
| $H_3SiSiH(CH_3)SiH(CH_3)_2$ | (No. 10A) |
| $H_3SiSiH_2SiH_2SiH_2(CH_3)$ | (No. 11A) |
| $H_3SiSiH_2SiH_2SiH(CH_3)_2$ | (No. 12A) |
| $H_3SiSiH_2SiH_2Si(CH_3)_3$ | (No. 13A) |
| and $H_3SiSi(CH_3)_2Si(CH_3)_2Si(CH_3)_3$ | (No. 14A) |

12. The method according to claim 1 in which the excitation energy is electric energy.

13. The method according to claim 1 in which the excitation energy is heat energy.

14. The method according to claim 1 in which the excitation energy is light energy.

15. The method according to claim 9 in which the excitation energy is electric energy.

16. The method according to claim 9 in which the excitation energy is heat energy.

17. The method according to claim 9 in which the excitation energy is light energy.

* * * * *

UNITED STATES PATENT AND TRADEMARK OFFICE
CERTIFICATE OF CORRECTION

PATENT NO. : 4,546,008
DATED : October 8, 1985
INVENTOR(S) : KEISHI SAITOH, ET AL.

It is certified that error appears in the above-identified patent and that said Letters Patent is hereby corrected as shown below:

Column 2, line 21, change "$S_2H_6$" to --$Si_2H_6$--

Column 4, line 27, change "a-Ai" to --a-Si-- line 37, change "alkoxylgroup" to --alkoxyl group-- line 61, change "ot" to --to--

Column 7, Table 1A, first column, after "characteristics" insert --*--

Table 1A, first column, before ":Good" insert --O--

Table 1A, first column, before ":Stable" insert --⊙--

Table 2A, first column, before ":Good" insert --O--

Column 8, line 21, change "descharge" to --discharge--

Column 9, Table 1B, first column, before "Very good" insert --⊙--; before "Good" insert --O--.

Table 1B, in Electric characteristics row, change "⊙ △ ⊙ △ ⊙ ⊙ △ ⊙ ⊙ ⊙ X" to --⊙ △ ⊙ △ O ⊙ △ O ⊙ O X--.

Signed and Sealed this

Twenty-fourth Day of February, 1987

Attest:

DONALD J. QUIGG

*Attesting Officer*      *Commissioner of Patents and Trademarks*